(12) United States Patent  
Chen

(10) Patent No.: US 8,941,221 B2  
(45) Date of Patent: Jan. 27, 2015

(54) SEMICONDUCTOR PACKAGE

(71) Applicant: Mediatek Inc., Hsin-Chu (TW)

(72) Inventor: Nan-Jang Chen, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 225 days.

(21) Appl. No.: 13/626,899

(22) Filed: Sep. 26, 2012

(65) Prior Publication Data

US 2013/0082371 A1 Apr. 4, 2013

Related U.S. Application Data

(60) Provisional application No. 61/541,235, filed on Sep. 30, 2011.

(51) Int. Cl.  
*H01L 23/495* (2006.01)

(52) U.S. Cl.  
CPC .... *H01L 23/49541* (2013.01); *H01L 23/49503* (2013.01); *H01L 23/49575* (2013.01); *H01L 23/49589* (2013.01); *H01L 2224/32245* (2013.01); *H01L 2224/48247* (2013.01); *H01L 2224/48257* (2013.01); *H01L 2224/49109* (2013.01); *H01L 2224/49113* (2013.01); *H01L 2224/49171* (2013.01); *H01L 2224/73265* (2013.01); *H01L 2924/3011* (2013.01)  
USPC .................................. 257/676; 257/E23.031

(58) Field of Classification Search  
CPC .................................................. H01L 23/495  
USPC ......................................... 257/666, 670, 728  
See application file for complete search history.

(56) References Cited

U.S. PATENT DOCUMENTS 6,093,957 A * 7/2000 Kwon ........................... 257/666  
6,258,629 B1 7/2001 Niones et al.

FOREIGN PATENT DOCUMENTS

| CN | 101350318 A | 1/2009 |
| JP | 870090 | 3/1996 |
| JP | 9293822 | 11/1997 |

OTHER PUBLICATIONS

"International Search Report" mailed on Jan. 3, 2013 for International application No. PCT/CN2012/082270, International fing date: Sep. 28, 2012.  
Swaminathan, Madhavan, Power Integrity Modeling and Design for Semiconductors and Systems, Nov. 19, 2007, Section1.13.~1.14.,1.2.4.  
Jan M. Rabaey, Digital Integrated Circuits, Jan. 18, 2002, p. 176,198.  
Vishram S. Pandit, Power Integrity for I/O Interfaces: With Signal Integrity/Power Integrity Co-Design, Oct. 13, 2010, Chapter 1.

* cited by examiner

*Primary Examiner* — Colleen A Matthews  
*Assistant Examiner* — William Harriston  
(74) *Attorney, Agent, or Firm* — Winston Hsu; Scott Margo

(57) ABSTRACT

A semiconductor package includes a die pad, at least one semiconductor die mounted on the die pad, a plurality of leads disposed along peripheral edges of the die pad, at least one connecting bar for supporting the die pad, a first power bar disposed on one side of the connecting bar, a second power bar disposed on the other side of the connecting bar, and a connection member traversing the connecting bar and electrically connecting the first power bar with the second power bar.

17 Claims, 5 Drawing Sheets

SEMICONDUCTOR PACKAGE

CROSS REFERENCE TO RELATED APPLICATIONS

This application claims the benefit of U.S. provisional application No. 61/541,235, filed Sep. 30, 2011.

BACKGROUND

The present invention relates generally to integrated circuit (IC) package technology. More particularly, the present invention relates to a semiconductor package including a leadframe with power bars or power ring, which is capable of improving power supply variations and suppressing power noise.

Semiconductor dies are conventionally enclosed in plastic packages that provide protection from harsh environments and enable electrical interconnection between the semiconductor die and a substrate or circuit board. Such an integrated circuit (IC) package typically includes a metal substrate or a leadframe, a semiconductor die mounted on a die pad of the leadframe, and bond wires electrically connecting bond pads on the semiconductor die to inner leads of the leadframe. The leadframe, the bond wires, and the semiconductor die are typically encapsulated in a molding compound.

The technology trends in the back-end packaging industry can be summarized as "more functionality in a smaller space". The integrated circuit chip is becoming more and more complicated, leading to increased number of external connection pins of the leadframe package. As the pin count is increased, the cost of packaging is increased accordingly.

Further, as the integration and performance of semiconductor dies increase, the impact of power noise on I/O signaling is significant. It is desirable to provide of stable supply voltage during chip operation. Furthermore, in some circumstances, a number of bond wires extending from bond pads on a chip are bonded onto one single inner lead of a leadframe in the package. The crowded wires bonded to one single lead result in reliability and yield issues.

In light of the above, there is a strong need in this industry to provide an improved semiconductor package structure and leadframe package, which are cost-effective, particularly suited for high-speed semiconductor dies, and are capable of improving power supply variations and suppressing power noise.

SUMMARY

In one aspect, this disclosure provides a semiconductor package including a die pad, at least one semiconductor die mounted on the die pad, a plurality of leads disposed along peripheral edges of the die pad, at least one connecting bar for supporting the die pad, a first power bar disposed on one side of the connecting bar, a second power bar disposed on the other side of the connecting bar, and a connection member traversing the connecting bar and electrically connecting the first power bar with the second power bar.

In another aspect, this disclosure provides a semiconductor package including a die pad, a least one semiconductor die mounted on the die pad, a plurality of inner leads in a first horizontal plane along peripheral edges of the die pad, a plurality of connecting bars supporting the die pad, and a power ring circumventing the die pad. The power ring is composed of a plurality of power bars extending between the connecting bars. The power bars are electrically connected together with connection members traversing the connecting bars.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
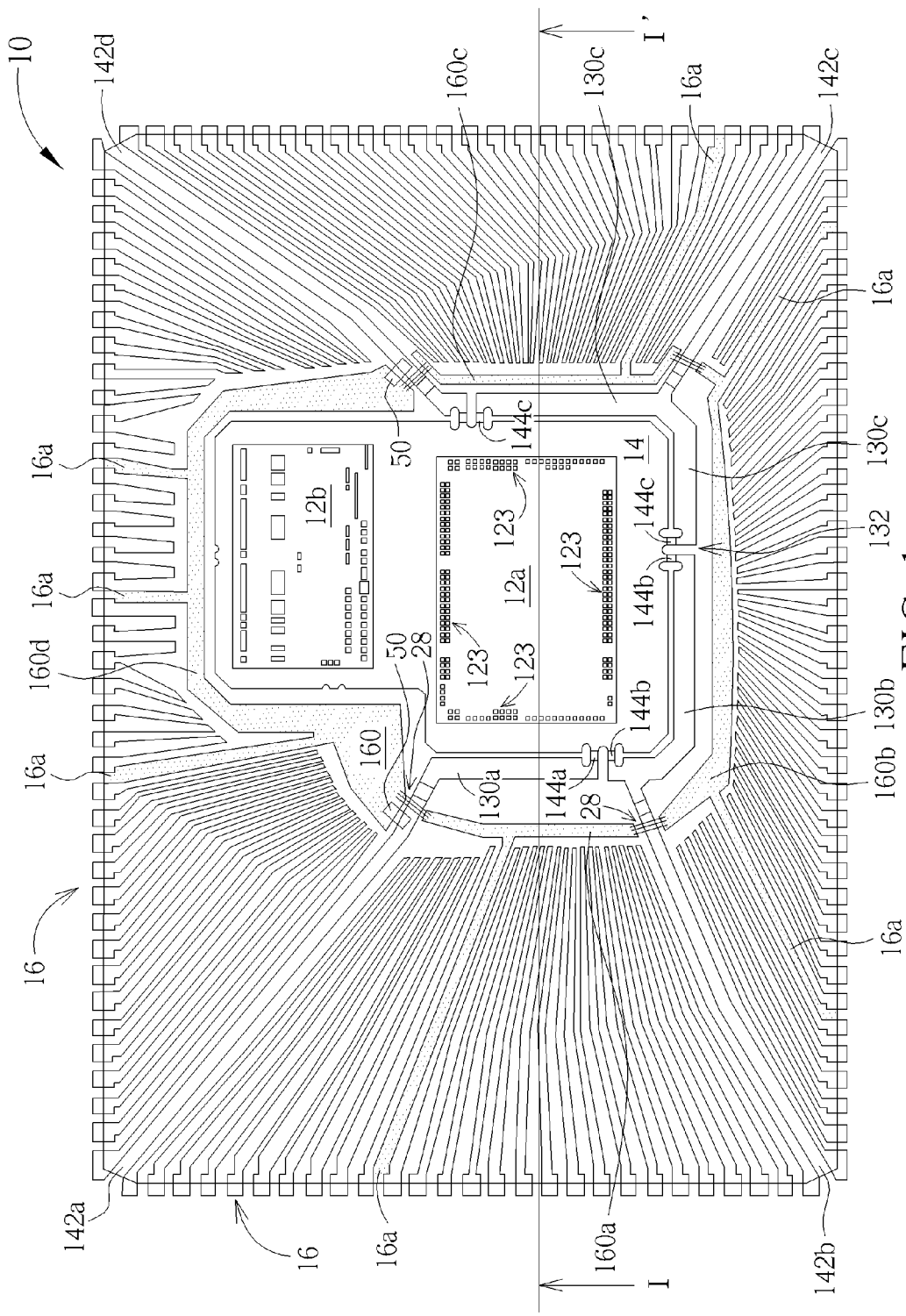
FIG. 1 illustrates a schematic top view of an exemplary leadframe package according to one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The present invention pertains to an improved semiconductor package, as described below, which is suited for the applications including, but not limited to, LQFP (Low-Profile Quad Flat Pack) packaging, TQFP (Thin Quad Flat Pack) packaging, QFN (Quad Flat Non-leaded) packaging, DFN (Dual Flat No-lead) packaging, multi-zone QFN, multi-die flip-chip packaging, and other applicable packaging technology.

Figure 2:
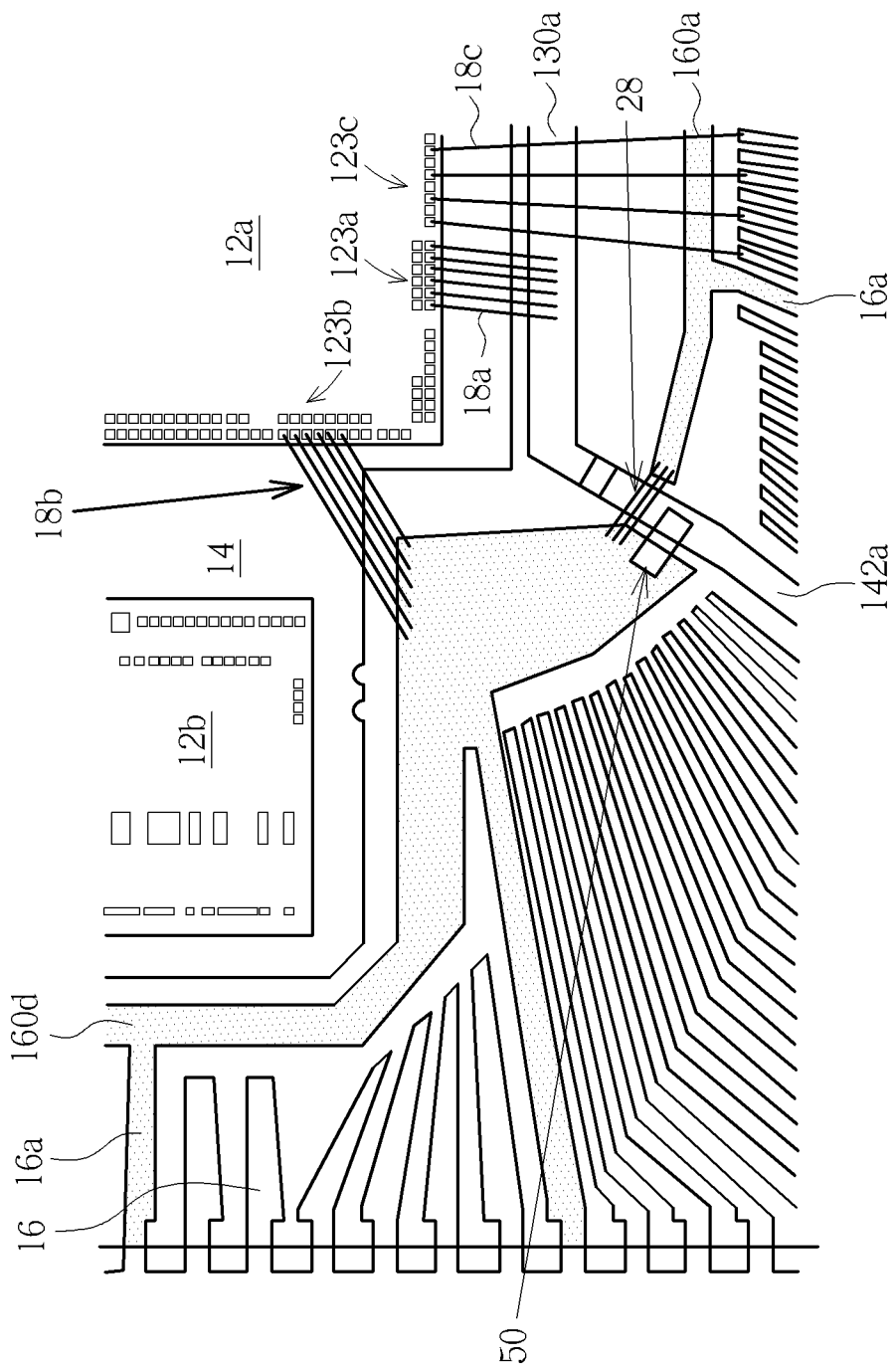
FIG. 2 is an enlarged top view showing a germane portion of the leadframe package of FIG. 1.
Figure 3:
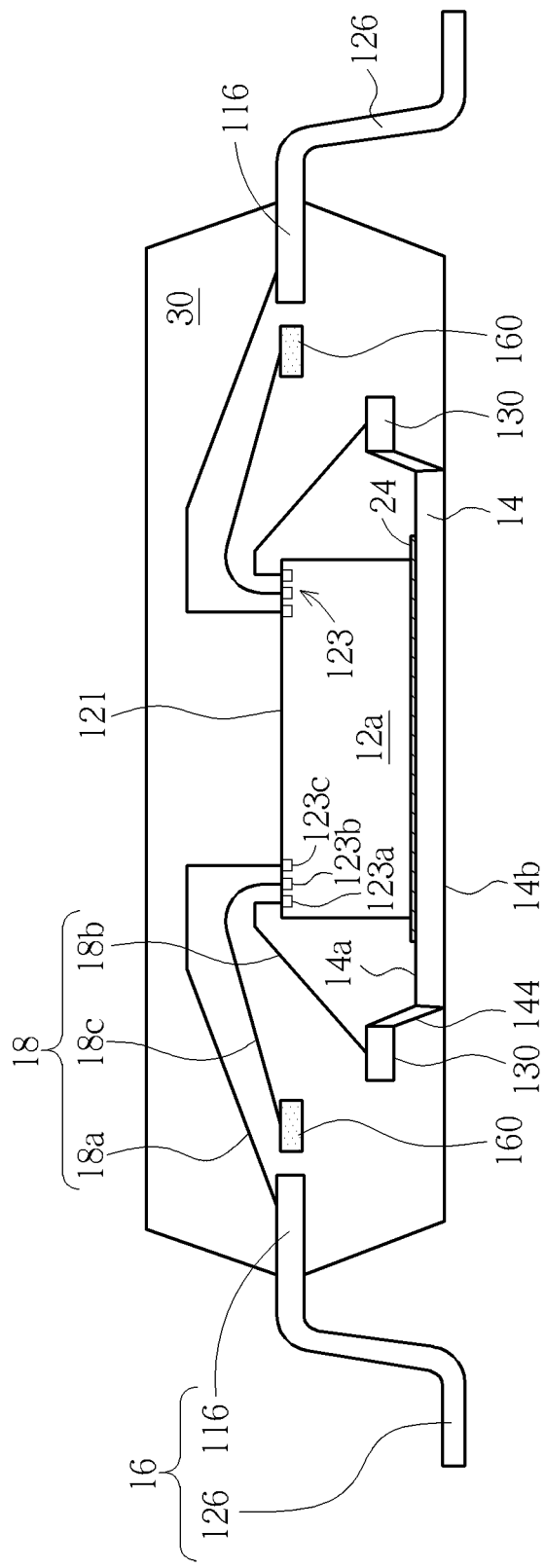
FIG. 3 is a schematic, cross-sectional view taken along line I-I' of FIG. 1.

Please refer to FIGS. 1-3. FIG. 1 illustrates a schematic top view of an exemplary leadframe package 10 according to one embodiment of the invention. FIG. 2 is an enlarged top view showing a germane portion of the leadframe package 10. FIG. 3 is a schematic, cross-sectional view taken along line I-I' of FIG. 1. As shown in FIGS. 1-3, in general, the leadframe package 10 includes at least one semiconductor die 12a that is mounted on a die pad 14 and is adhered to a top surface 14a of the die pad 14 by using an adhesive 24 such as silver paste or epoxy. According to one embodiment, the bottom surface 14b of the die pad 14 may be exposed within the package body. The exposed bottom surface 14b of the die pad 14 helps dissipate heat generated by the semiconductor die 12a, which is also known as an exposed die pad or E-pad configuration. Typically, the exposed bottom surface 14b of the die pad 14 may be used for electrically connecting to a ground layer of a printed circuit board (PCB). According to one embodiment, four slender connecting bars 142a-142d extend inward from respective four corners of the leadframe package 10 to support the die pad 14. Leads 16 including inner leads 116 and outer leads 126 are arranged along the peripheral edges of the die pad 14, which provide electrical connection between the semiconductor die 12a and other devices such as a circuit board. The semiconductor die 12a and the leadframe including the die pad 14 and the inner leads 116 are encapsulated in a molding compound 30.

According to one embodiment, the semiconductor die 12a may be a TV chip or a system-on-a-chip (SoC) chip for digital TV applications, but should not be limited thereto. According to one embodiment, the leadframe package 10 may further include a semiconductor chip 12b. The semiconductor die 12a and the semiconductor chip 12b are disposed side-by-side and are arranged on the same plane (top surface 14a) of the die pad 14. For example, the semiconductor chip 12b may be a DDR2 or DDR3 DRAM chip, but should not be limited thereto. According to one embodiment, the semiconductor chip 12b may be situated farther from a $V_{CCK}$ core power supply rail of a two-layer printed circuit board (not shown) than the semiconductor die 12a. According to one embodiment, several rows of bond pads 123 may be provided on an active top surface 121 of the semiconductor die 12a along four side edges thereof.

According to one embodiment, the inner leads 116 are arranged in a first horizontal plane along the peripheral edges of the die pad 14. The leadframe package 10 may further comprise a ground bar 130 downset from the first horizontal plane to a lower second horizontal plane between the inner leads 116 and the die pad 14, and a plurality of downset tie bars 144 connecting the ground bar 130 with the die pad 14. According to one embodiment, the ground bar 130 extends along at least one peripheral edge of the die pad 14 and is integrally connected to one of the connecting bars 142. Therefore, the ground bar 130, the connecting bars 142, and the die pad 14 have the same voltage potential, i.e., ground level.

In FIG. 1, for example, the leadframe package 10 comprises a first ground bar 130a extending along at one peripheral edge segment of the die pad 14, a second ground bar 130b extending along at two peripheral edge segments of the die pad 14, and a third ground bar 130c extending along at two peripheral edge segments of the die pad 14, such that the first, second and third ground bars partially circumvent the die pad 14. The first ground bar 130a with its one distal end connecting to the first connecting bar 142a is integrally connected to the die pad 14 with a downset tie bar 144a. A discontinuity or gap 132 is formed between the first ground bar 130a and the second ground bar 130b. The second ground bar 130b is integrally connected to the die pad 14 with downset tie bars 144b and is integrally connected to the second connecting bar 142b. Likewise, a discontinuity or gap 132 is provided between the second ground bar 130b and the third ground bar 130c. The third ground bar 130c is integrally connected to the die pad 14 with downset tie bars 144c and is integrally connected to the third connecting bar 142c. In this case, no ground bar is provided around the semiconductor chip 12b.

According to one embodiment, the leadframe package 10 further comprises a power bar 160 disposed on either side of one connecting bar 142 and does not contact the connecting bar 142. That is, the power bar 160 is electrically isolated from the connecting bar 142 and provides power signal having different voltage level from ground level of the connecting bar 142. According to one embodiment, for example, the power bars 160 are flush with the inner leads 116 in the first horizontal plane and extend along the peripheral edges of the die pad 14. Each of the power bars 160 is respectively integrally connected to at least one power leads 16a that are designated to supply power voltage such as core power.

In FIG. 1, for example, a first power bar 160a extends substantially in parallel with the first ground bar 130a and between the first connecting bar 142a and the second connecting bar 142b. The first power bar 160a is integrally connected to one power lead 16a. A second power bar 160b extends substantially in parallel with the second ground bar 130b and between the second connecting bar 142b and the third connecting bar 142c. The second power bar 160b is integrally connected to two power leads 16a. The first power bar 160a is electrically connected to the second power bar 160b by using connection member 28 traversing the second connecting bar 142b. For example, the connection member 28 may comprise bond wires, conductive straps, jumpers or resistors with zero resistance (0Ω resistors), or the like. The connection member 28 does not contact the second connecting bar 142b. A third power bar 160c extends substantially in parallel with the third ground bar 130c and between the third connecting bar 142c and the fourth connecting bar 142d. The third power bar 160c is integrally connected to one single power lead 16a. Likewise, the second power bar 160b is electrically connected to the third power bar 160c by using connection member 28 traversing the third connecting bar 142c.

A fourth power bar 160d extends along three peripheral edges segments of the die pad 14 between the first connecting bar 142a and the fourth connecting bar 142d. The fourth power bar 160d partially circumvents the die pad 14 and is disposed adjacent to the semiconductor chip 12b. As shown in FIG. 1, the fourth power bar 160d is integrally connected to three power lead 16a. The fourth power bar 160d is electrically connected to the third power bar 160c by using connection member 28 traversing the fourth connecting bar 142d. Optionally, a decoupling capacitor 50 may be mounted between the fourth power bar 160d and the fourth connecting bar 142d for suppressing power noise. Likewise, the fourth power bar 160d is electrically connected to the first power bar 160a by using connection member 28 traversing the first connecting bar 142a. Optionally, a decoupling capacitor 50 may be mounted between the fourth power bar 160d and the first connecting bar 142a for suppressing power noise. According to the embodiment, the first, second, third and fourth power bars are electrically connected together so as to form a continuous power ring that completely circumvents the die pad 14, which reduces the power impedance and the power noise. However, it is to be understood that in some cases the first, second, third and fourth power bars may not be electrically connected together.

According to one embodiment, the bond pads 123 on the semiconductor die 12a, which are also known as input/output pads or I/O pads, may generally comprise ground pads 123a, power pads 123b, and signal pads 123c, etc. The bond pads 123 are electrically coupled to corresponding ground bar 130, the inner leads 116, or the power bar 160 through bond wires 18. For example, the ground pads 123a are electrically coupled to the ground bar 130 through the bond wires 18a, the power pads 123b are electrically coupled to the power bar 160 through the bond wires 18b, and the signal pads 123c are electrically coupled to the inner leads 116 through the bond wires 18c. More bond wires can be bonded due to the larger area of the power bar that will improve the crowded wires bonded to one single lead resulting in reliability and yield issues.

Figure 4:
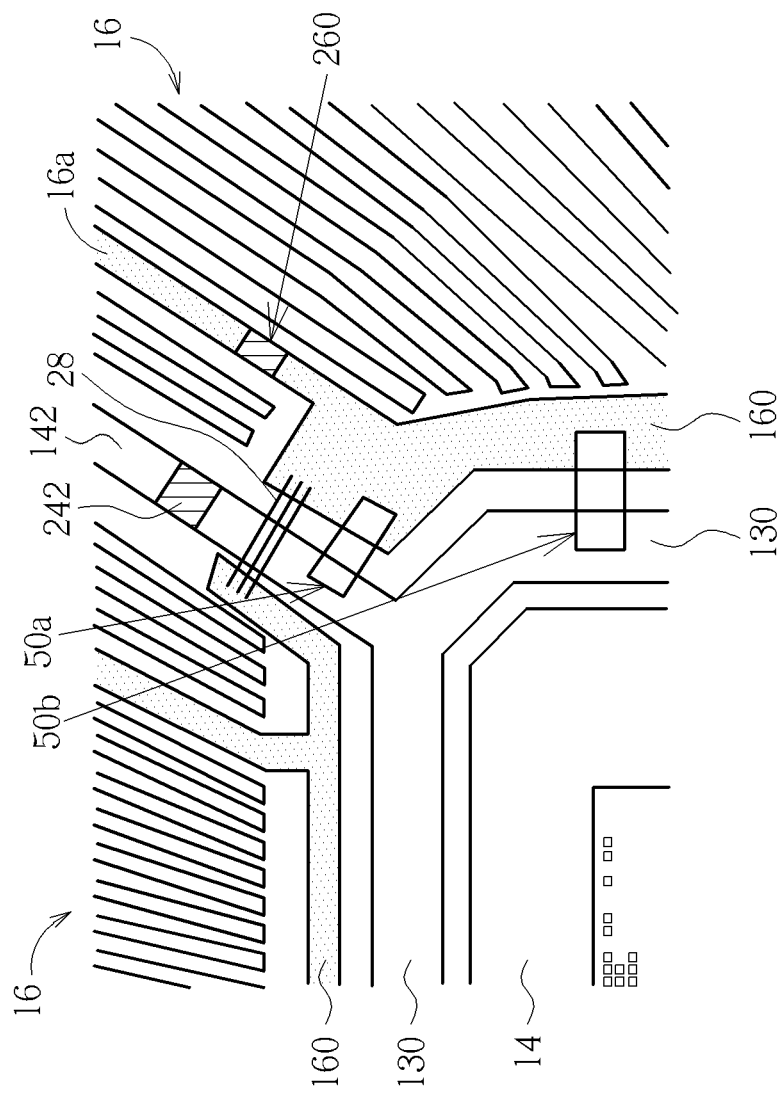
FIG. 4 is enlarged top view showing a germane portion of a leadframe package in accordance with another embodiment of the invention.
Figure 5:
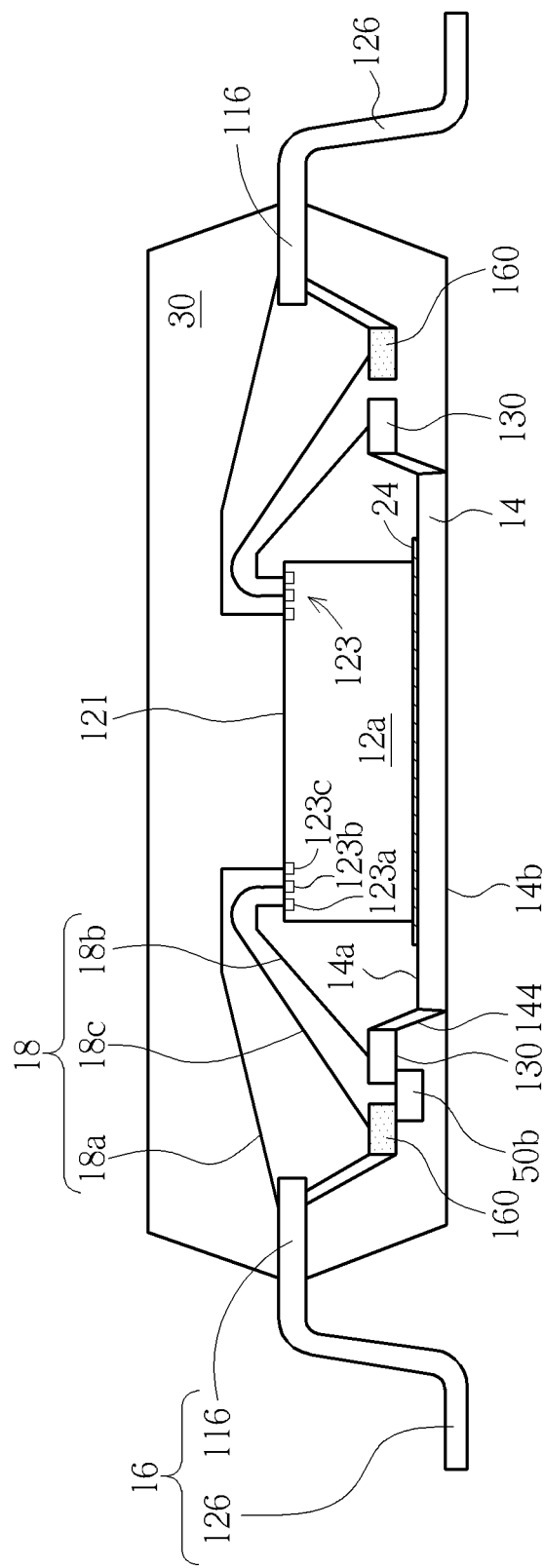
FIG. 5 is a schematic, cross-sectional diagram showing a leadframe package in accordance with another embodiment of the invention.

FIG. 4 is enlarged top view showing a germane portion of a leadframe package in accordance with another embodiment of the invention. FIG. 5 is a schematic, cross-sectional diagram showing a leadframe package in accordance with another embodiment of the invention, wherein like regions, layers or elements are designated by like numeral numbers. As shown in FIG. 4 and FIG. 5, the connecting bar 142 has a downset structure 242. A downset structure 260 is provided between the power lead 16a and the power bar 160, such that the power bar 160 can be coplanar with the ground bar 130. A decoupling capacitor 50a is mounted between the power bar 160 and the downset connecting bar 142 and a decoupling capacitor 50b is mounted between the power bar 160 and the ground bar 130.

To sum up, this disclosure at least contains the following benefits and advantages. 1). Lower power impedance can be achieved because more power wires can be bonded on a large area of the power bars. 2). Shorter decoupling path due to the incorporation of the in-package decoupling capacitors. 3). Higher assembly yield can be achieved due to relief of the power wires density on the power bar. 4) Less power lead is possible because additional power ring is added to reduce power impedance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a die pad;
    a first semiconductor die mounted on the die pad;
    a plurality of inner leads comprising a first power lead and a second power lead disposed along peripheral edges of the die pad;
    at least one connecting bar for supporting the die pad;
    a first power bar disposed on one side of the connecting bar, wherein the first power bar is integrally connected to the first power lead;
    a second power bar disposed on the other side of the connecting bar; and
    a connection member traversing the connecting bar and electrically connecting the first power bar with the second power bar.

2. The semiconductor package according to claim 1 wherein the second power bar is integrally connected to the second power lead.

3. The semiconductor package according to claim 1 wherein the first and second power bars are both electrically isolated from the connecting bar.

4. The semiconductor package according to claim 1 wherein the connection member comprises at least one of a bond wire, a conductive strap, a jumper or a resistor with zero resistance (0Ω resistor).

5. The semiconductor package according to claim 1 further comprising a second semiconductor die mounted on the die pad.

6. The semiconductor package according to claim 1 further comprising at least a ground bar extending along at a peripheral edge segments of the die pad.

7. The semiconductor package according to claim 6 wherein the ground bar is integrally connected to the connecting bar.

8. The semiconductor package according to claim 6 wherein the ground bar is integrally connected to the die pad with a downset tie bar.

9. The semiconductor package according to claim 6 wherein at least one of the first and second power bars is flush with the ground bar.

10. The semiconductor package according to claim 9 wherein at least a decoupling capacitor is mounted between the at least one of the first and second power bars and the ground bar.

11. The semiconductor package according to claim 1 wherein the first and second power bars are both flush with the inner leads.

12. The semiconductor package according to claim 1 wherein at least a decoupling capacitor is mounted between the connecting bar and at least one of the first and second power bars.

13. A semiconductor package, comprising:
    a die pad;
    a least one semiconductor die mounted on the die pad;
    a plurality of inner leads in a first horizontal plane along peripheral edges of the die pad, wherein the inner leads comprise a power lead;
    a plurality of connecting bars for supporting the die pad; and
    a power ring circumventing the die pad, wherein the power ring is composed of a plurality of power bars extending between the connecting bars, and wherein the power bars are electrically connected together with connection members traversing the connecting bars, wherein at least one of the power bars is integrally connected to the power lead.

14. The semiconductor package according to claim 13 wherein the power ring is flush with the inner leads.

15. The semiconductor package according to claim 13 wherein the power ring is downset from the first horizontal plane to a second horizontal plane.

16. The semiconductor package according to claim 13 wherein the power bars are electrically isolated from the connecting bars.

17. The semiconductor package according to claim 13 wherein at least a decoupling capacitor is mounted between one of the power bars and the connecting bar.

* * * * *